(12) United States Patent
Ali

(10) Patent No.: US 7,190,577 B2
(45) Date of Patent: Mar. 13, 2007

(54) COOLING SYSTEM WITH INTEGRATED PASSIVE AND ACTIVE COMPONENTS

(75) Inventor: Ihab Ali, San Jose, CA (US)

(73) Assignee: Apple Computer, Inc., Cupertino, CA (US)

( * ) Notice: Subject to any disclaimer, the term of this patent is extended or adjusted under 35 U.S.C. 154(b) by 145 days.

(21) Appl. No.: 10/951,953

(22) Filed: Sep. 28, 2004

(65) Prior Publication Data

US 2006/0067045 A1    Mar. 30, 2006

(51) Int. Cl.
*G06F 1/20* (2006.01)
(52) U.S. Cl. .................................... 361/687; 361/683
(58) Field of Classification Search ............... 361/687
See application file for complete search history.

(56) References Cited

U.S. PATENT DOCUMENTS 6,019,165 A * 2/2000 Batchelder ................ 165/80.3
6,058,012 A * 5/2000 Cooper et al. .............. 361/704
6,175,493 B1 * 1/2001 Gold .......................... 361/687
6,400,565 B1 * 6/2002 Shabbir et al. ............. 361/687
6,863,117 B2 * 3/2005 Valenzuela ............. 165/104.26

* cited by examiner

*Primary Examiner*—Yean-Hsi Chang
(74) *Attorney, Agent, or Firm*—Sawyer Law Group LLP

(57) ABSTRACT

A cooling system for a computer includes a heat spreader that is in thermal contact with at least one component in the computer, a frame casting, and at least one heat pipe coupled to the heat spreader and coupled to the frame casting for passively dissipating heat generated from the at least one component in the computer. By coupling the heat spreader to the frame casting via the at least one heat pipe, the conductive and convective heat transfer characteristics of the frame casting are utilized to provide additional passive cooling for the at least one component.

14 Claims, 10 Drawing Sheets

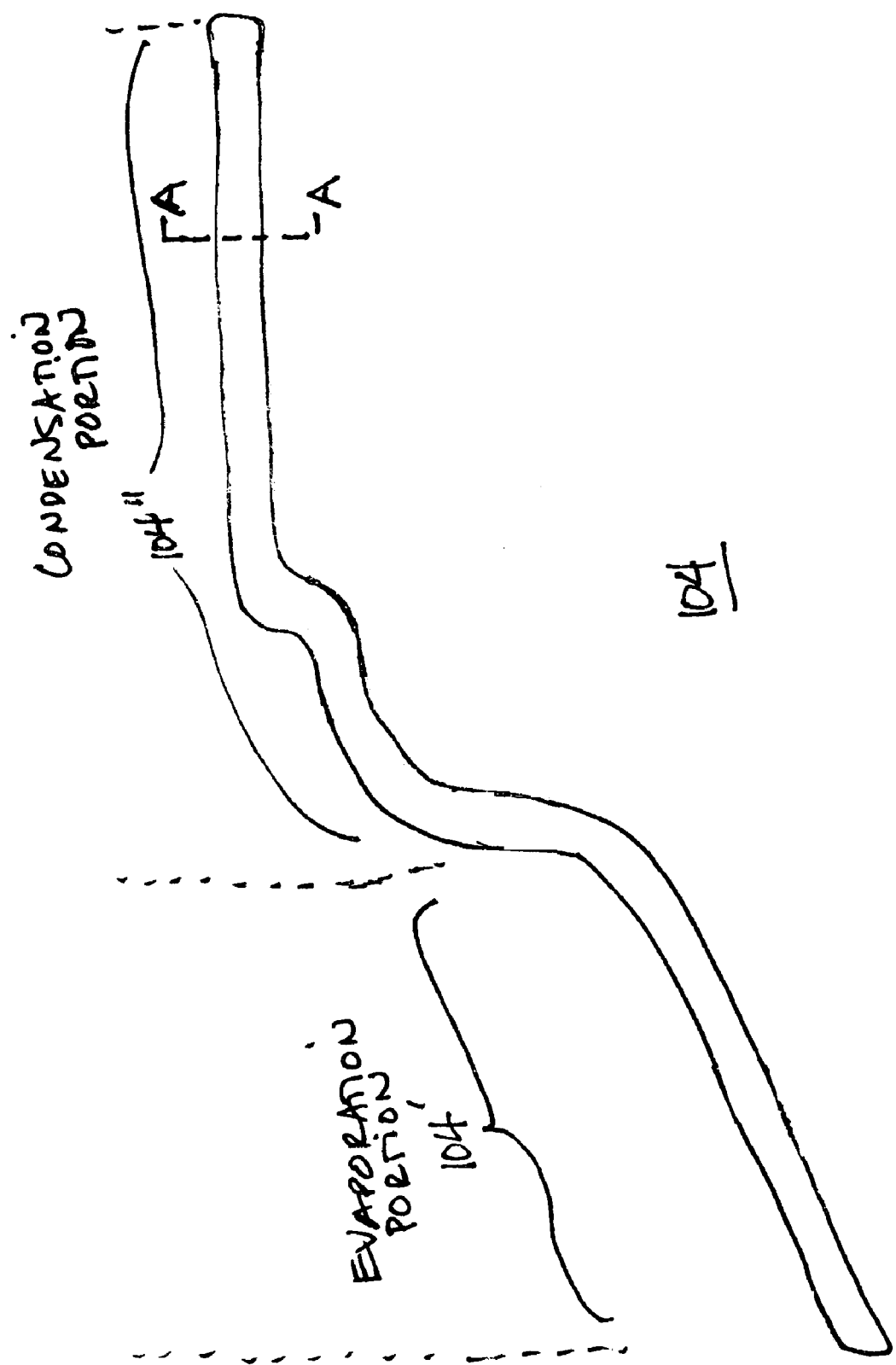

FIG. 6  A--A

COOLING SYSTEM WITH INTEGRATED PASSIVE AND ACTIVE COMPONENTS

FIELD OF THE INVENTION

The present invention relates to a cooling system for a computer system, and more particularly to a cooling system with integrated passive and active cooling mechanisms that allow for multiple levels of cooling.

BACKGROUND OF THE INVENTION

As computer components evolve into more powerful devices, their power requirements consequently increase. With this increase in power consumption, a commensurate increase in power dissipation in the form of heat results. For example, in a laptop computer system, microprocessors, such as a central processing unit (CPU) and a graphical processing unit (GPU), and a chipset are major sources of heat.

Heat dissipation is an important consideration in the design of modern-day computer systems. If heat is not adequately dissipated from the system, components may fail causing catastrophic damage to the system. To date, cooling systems have utilized finned heat sinks, augmented by axial flow fans mounted on the heat sink and/or air movers in the form of fans within or around the computer system. Nevertheless, as the amount of heat generated by the components increases, the current cooling systems will prove inadequate because larger heat sinks and/or fans will not fit into the already cramped space in and around a computer system.

Accordingly, a need exists for a more efficient system for cooling components in a computer system. The system should be compact, highly reliable, and cost effective. The present invention fulfills this need and provides related advantages.

BRIEF SUMMARY OF THE INVENTION

The present invention provides a cooling system for a computer. In a first aspect, the cooling system includes a heat spreader that is in thermal contact with at least one heat generating component in the computer, a frame casting, and at least one heat pipe coupled to the heat spreader and coupled to the frame casting for passively dissipating heat generated from the at least one component in the computer.

In a second aspect, the heat spreader includes a plurality of channels that increase the heat spreader's ability to dissipate heat into the ambient air inside the computer. Moreover, when a fan blows air within the computer, the channels are configured such that they direct air flow to the fan to be exhausted out of the computer.

In another aspect, the at least one heat pipe is also coupled to a fin stack located at a vent in the frame casting such that the fin stack improves passive heat dissipation from the heat pipe. When a fan is exhausting air out of the vent, the exhausted air actively cools the heat pipe, fin stack and frame casting, thereby improving the overall heat dissipation even further.

According to the cooling system disclosed, the conductive and convective heat transfer characteristics of the frame casting are utilized to significantly improve heat dissipation. Passive and active cooling mechanisms are integrated into the cooling system and, depending on the temperature of the computer system at any given time, one mechanism or both can be utilized. Thus, the cooling system of the present invention offers multiple levels of cooling capacity.

BRIEF DESCRIPTION OF SEVERAL VIEWS OF THE DRAWINGS

FIG. 4 is a perspective view of the heat pipe according to a preferred embodiment of the present invention.

DETAILED DESCRIPTION OF THE INVENTION

The present invention relates to a cooling system for a computer system, and more particularly to a cooling system with integrated passive and active cooling mechanisms that allow for multiple levels of cooling. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

According to the present invention, a heat spreader that is in thermal contact with heat generating components in a computer system transfers thermal energy from the heat generating components to at least one heat pipe. Each heat pipe is embedded in the heat spreader at one end and is coupled to a frame casting of the computer system at an end opposite to the end embedded in the heat spreader. The heat pipe transfers waste heat from the components to the frame casting such that the superior conductive and convective heat transfer characteristics of the frame casting can be utilized to cool the components. Thus, by exploiting the heat dissipation characteristics of the heat spreader, the at least one heat pipe, and the computer's frame casting, the components in the computer system are cooled efficiently and effectively.

Figure 1:
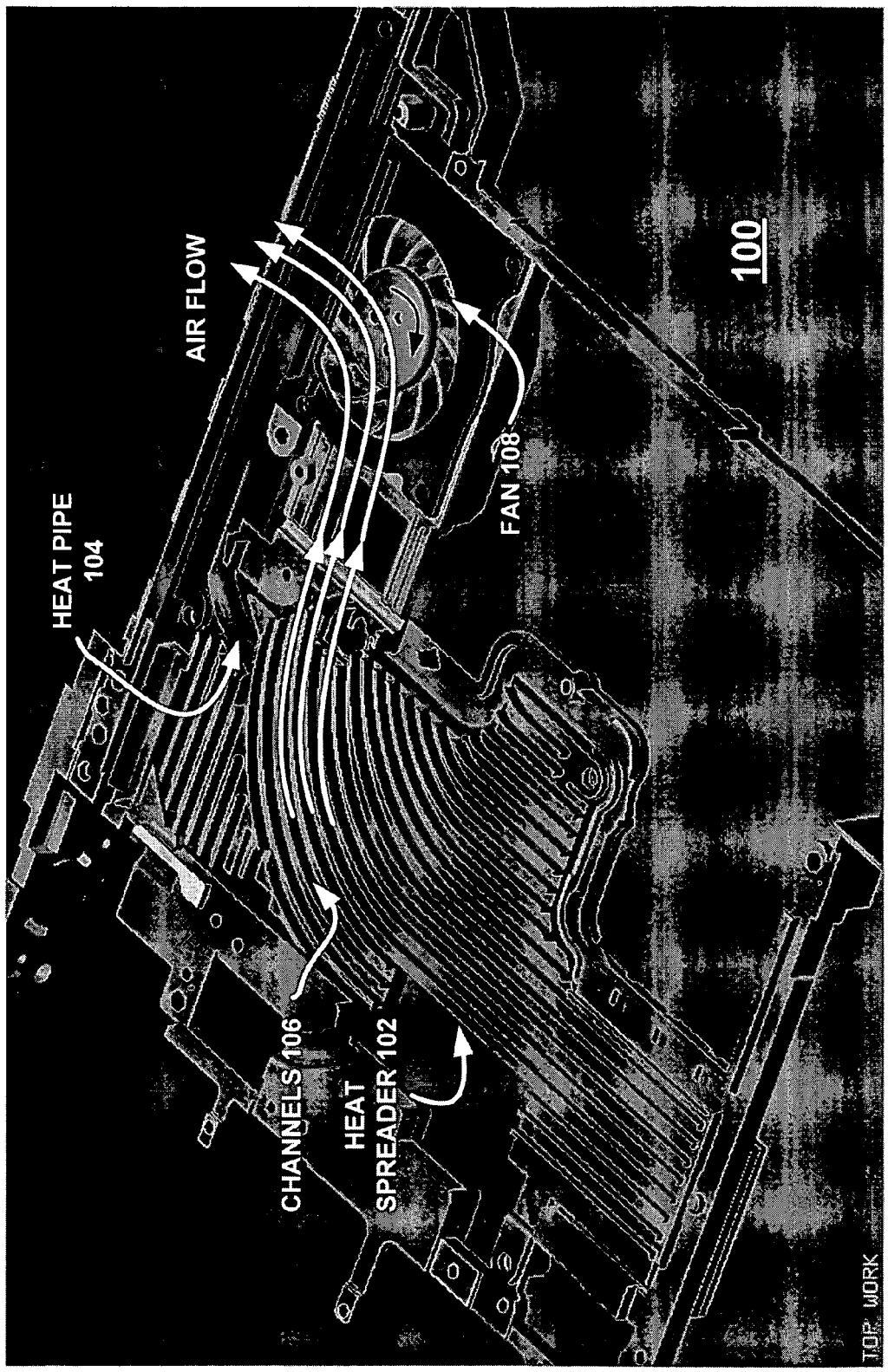
FIG. 1 is a front top perspective view of the cooling system according to a preferred embodiment of the present invention.
Figure 2:
FIG. 2 is a top back perspective view of the cooling system according to a preferred embodiment of the present invention.

FIG. 1, FIG. 2 and FIGS. 3A and 3B are front top, back top and back bottom views, respectively, of the cooling system according to a preferred embodiment of the present invention. Similar elements are identified by the same item numerals. Referring to FIGS. 1, 2, 3A, and 3B the cooling system 100 includes a heat spreader 102 (FIG. 1, FIG. 2) and a frame casting 110 (FIG. 2). The heat spreader 102 and the frame casting 110 are thermally connected by a heat pipe 104 that is embedded in the heat spreader 102 (FIG. 1, FIG. 3B) at one end and integrated with the frame casting 110 at the other end. Although only one heat pipe 104 is shown, multiple heat pipes 104 can utilized if and/or when feasible.

Figure 3A:
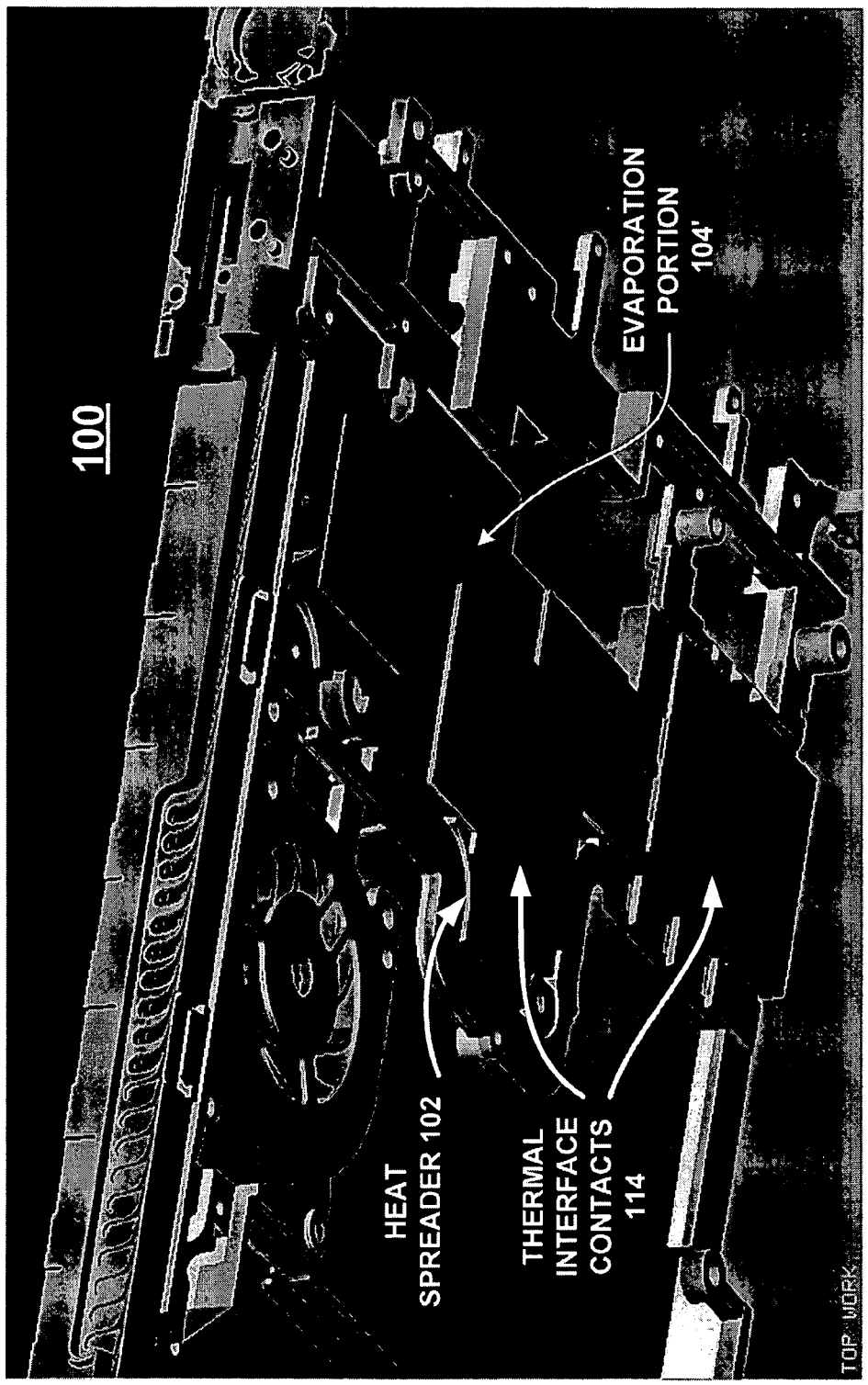
FIG. 3A is a bottom back perspective view of the cooling system according to a preferred embodiment of the present invention.
Figure 9:
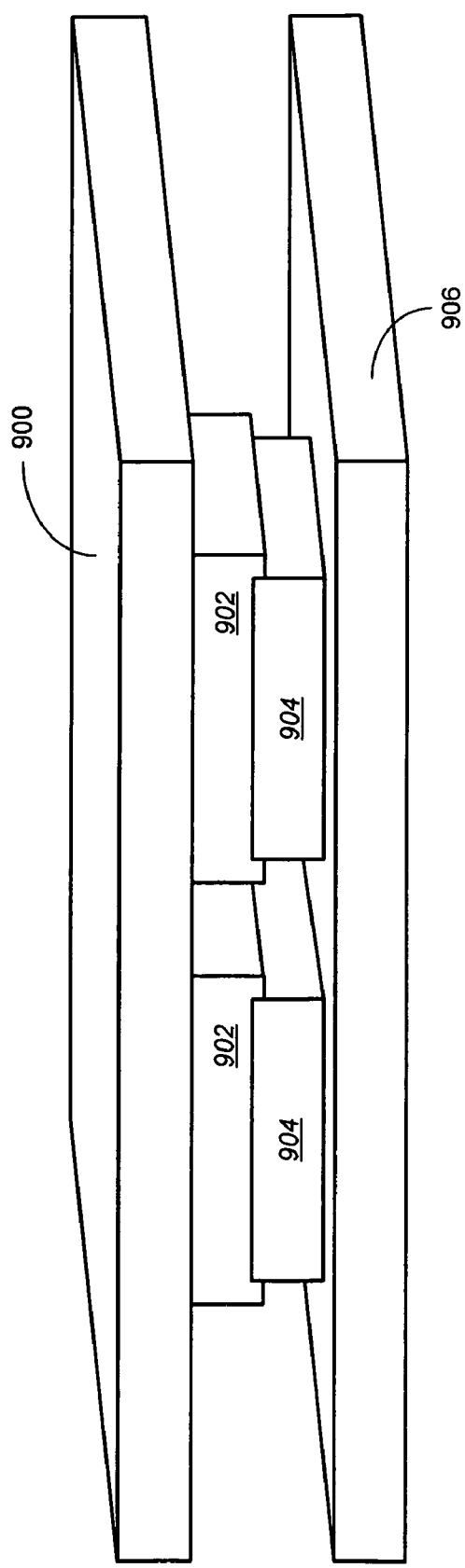
FIG. 9 illustrates a heat spreader in contact with a heat generating component according to one embodiment of the invention.

In general, heat generating components are coupled to a motherboard (not shown) and the heat spreader 102 is preferably positioned above the motherboard. As is shown in FIG. 3A, a bottom surface of the heat spreader 102 includes a plurality of thermal interface contacts 114 that are in direct contact with the heat generating components (not shown) in the computer system. The thermal interface contacts 114 minimize thermal resistance between the heat spreader 102 and the components, as is well known to those skilled in the art. Accordingly, heat generated by the components is transferred directly to the heat spreader 102, where the heat is dissipated into the ambient air in the computer. For example, FIG. 9 illustrates a cross-sectional view of a portion of a heat spreader 900 having a plurality of thermal interface contacts 902 that are respectively in direct contact with heat generating components 904. The heat generating components 904 are coupled to a motherboard 906. As discussed above, the heat generating components 904 can include components such as central processing unit (CPU), a graphical processing unit (GPU), or a chipset.

To further improve heat dissipation, one or more ancillary heat pipes 124 (FIG. 3A and FIG. 3B) are embedded into the heat spreader 102. As is shown in FIG. 3A, the ancillary heat pipe 124 makes direct contact with each of the thermal interface contacts 114, and facilitates the transfer of energy to the heat spreader 102, as well as to ambient air.

In a preferred embodiment, a top surface of the heat spreader 102 includes a plurality of channels 106 (FIG. 1) that increase the heat transfer rate between the heat spreader 102 and the ambient air in the computer. In a preferred embodiment, the channels 106 are formed in such a manner that each channel "points" or leads to a center of a radial fan 108. When the fan 108 is in operation, the channels 106 help direct waste air to the fan 108 where it is exhausted out of the computer. Thus, the channels 106 improve air circulation through the computer by reducing airflow resistance thereby improving overall heat dissipation.

Figure 3B:
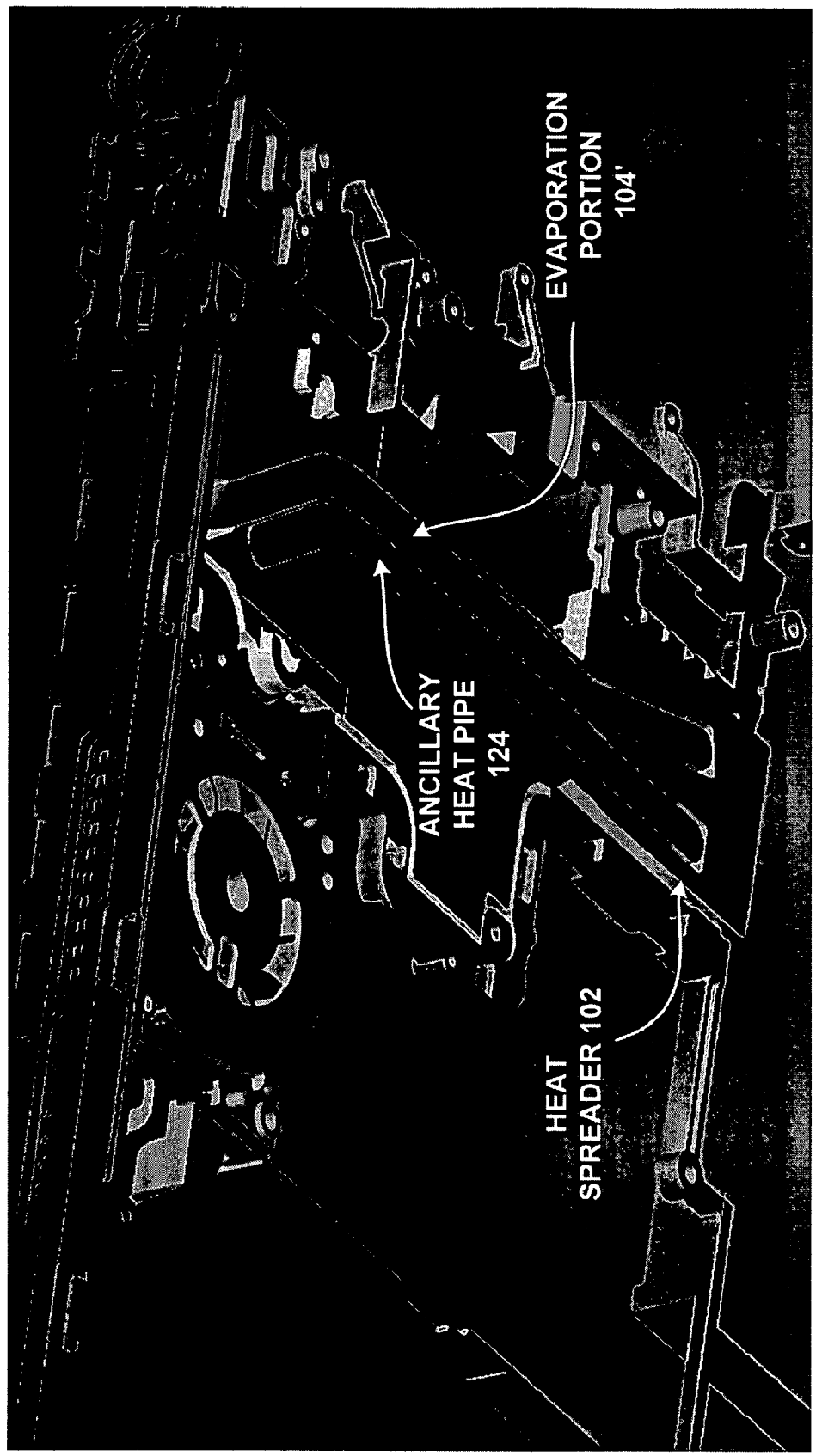
FIG. 3B is a bottom back perspective view of the cooling system showing the heat pipe and ancillary heat pipe according to a preferred embodiment of the present invention.

As stated above, the heat pipe 104 thermally connects the heat spreader 102 to the frame casting 110 so that the frame casting 110 can be utilized as an additional source for passively cooling the components. FIG. 4 is a perspective view of the heat pipe 104 according to a preferred embodiment of the present invention. Referring to FIG. 3B and FIG. 4, according to the preferred embodiment of the present invention, a first portion of the heat pipe, referred to as an evaporation portion 104', is embedded in the heat spreader 102 (FIG. 3B). The first portion of the heat pipe 104' is considered an evaporation section of the heat pipe 104 because here, the heat generated by the components is transferred to a coolant inside the heat pipe 104, which evaporates the coolant.

As is seen in FIG. 3A and FIG. 3B, the evaporation portion of the heat pipe 104' makes direct contact with each of the thermal interface contacts 114. The bottom surface of the heat spreader 102 and the contact surface of the evaporation portion of the heat pipe 104' are preferably press fit or fly cut to ensure that the evaporation portion of the heat pipe 104' is co-planar with and in direct contact with the heat generating components thereby further decreasing thermal resistance.

Referring again to FIG. 4, the heat pipe 104 also includes a second portion, referred to as a condensation portion 104", which is in thermal contact with the frame casting 110. Referring again to FIG. 1, the condensation portion of the heat pipe 104" extends from the heat spreader 102 to the frame casting 110 to form a thermal path between the heat spreader 102 and the frame casting 110. The condensation portion of the heat pipe 104" is referred to as a condensation segment because here, the vaporized coolant cools, i.e., transfers its thermal energy to the frame casting 110, and the coolant transforms back to a liquid state.

Figure 5:
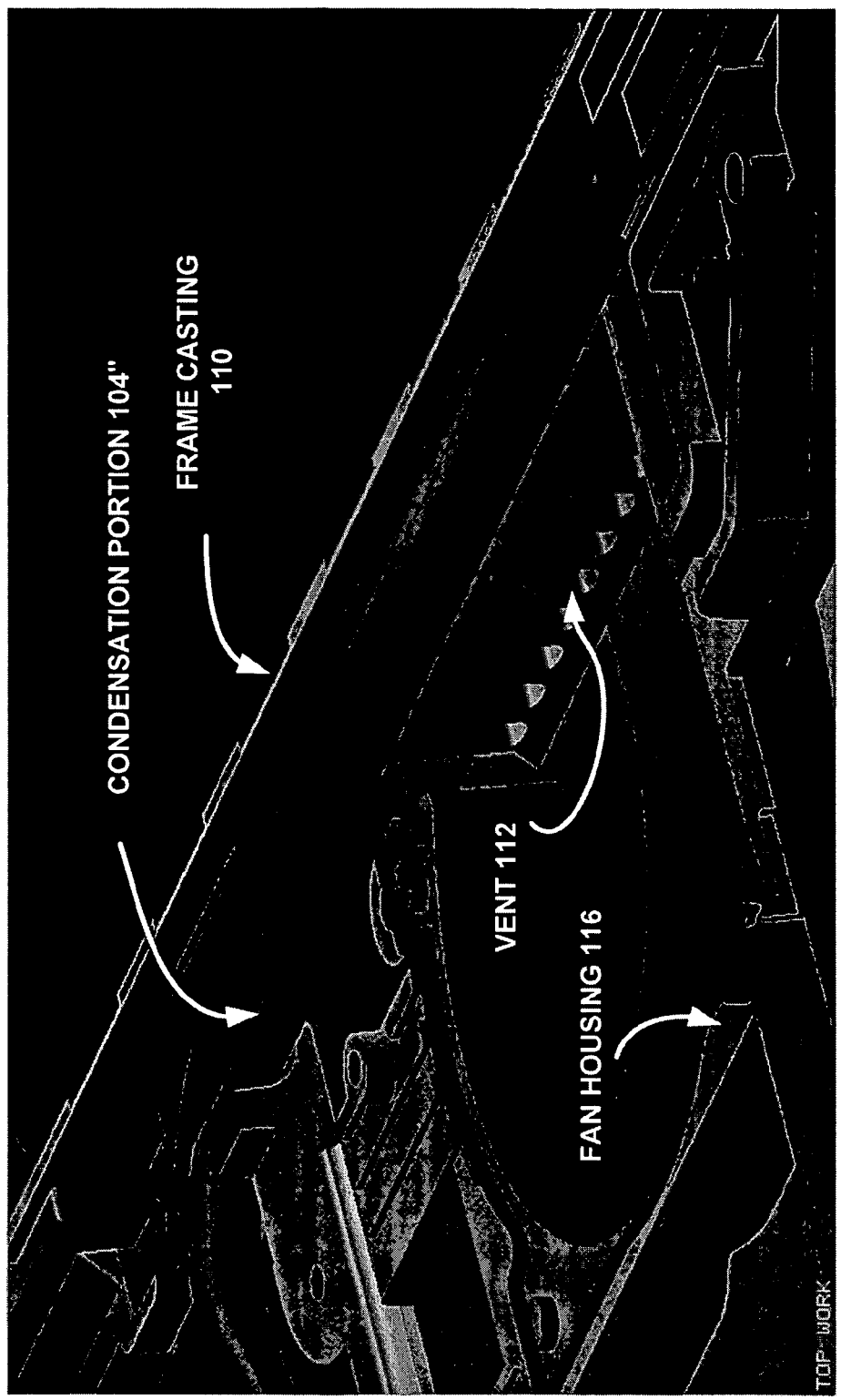
FIG. 5 is a view of the heat pipe, frame casting, and fan housing according to a preferred embodiment of the present invention.

FIG. 5 is a view of the condensation portion of the heat pipe 104" in relation to the frame casting 110 according to a preferred embodiment of the present invention. As is shown, the condensation portion 104" makes direct thermal contact with the frame casting 110 and maintains thermal contact with the frame casting 110 along the length of the frame casting 110. Moreover, the condensation portion 104" is flattened to form a rectangular cross-section where the longer side is in contact with the frame casting 110. Flattening the condensation portion 104" in this manner increases the surface area in contact with the frame casting 110 and therefore increases passive heat dissipation.

Figure 6:
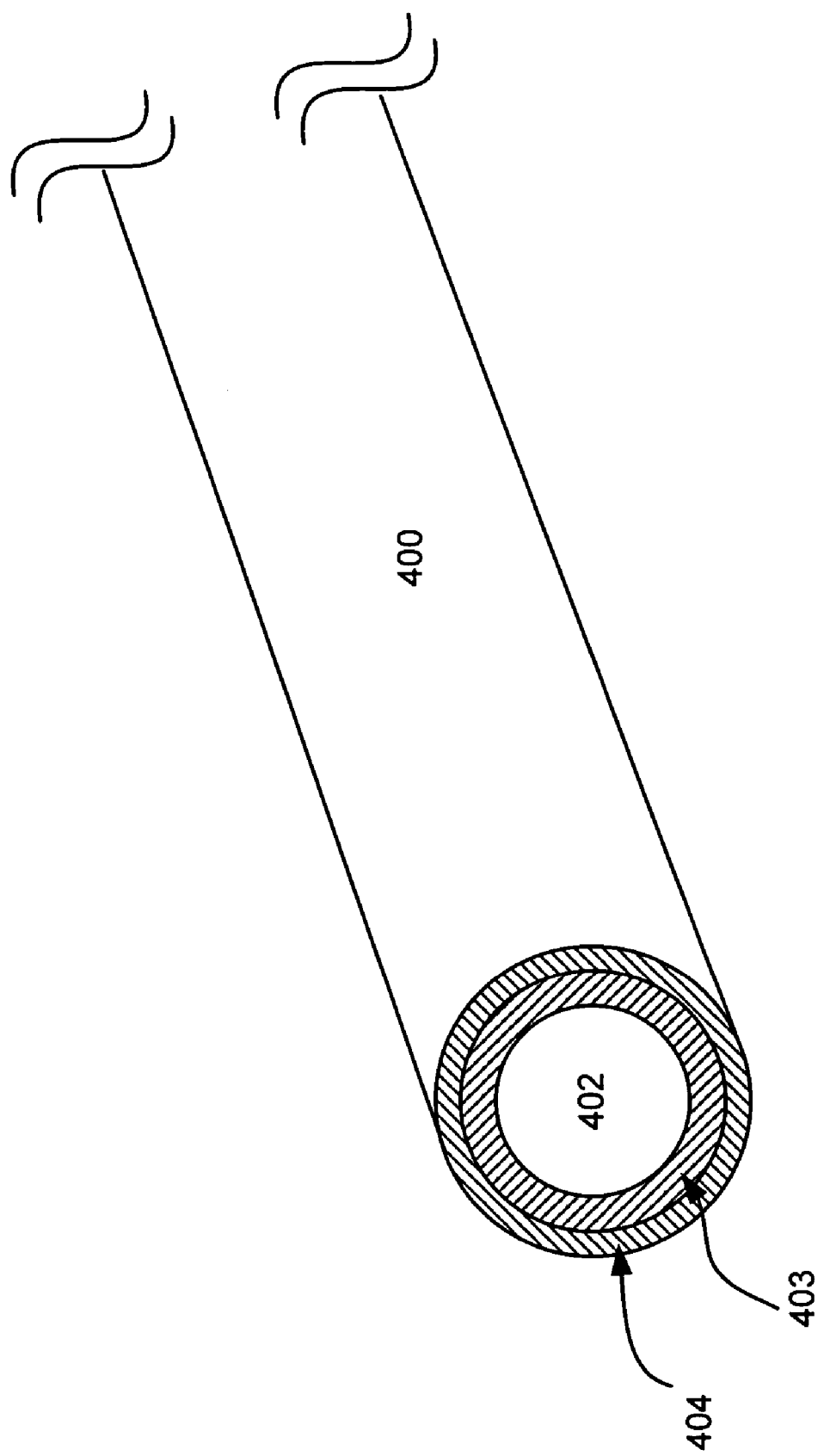
FIG. 6 is a cross-section of a heat pipe according to a preferred embodiment of the present invention.

FIG. 6 is a cross-sectional view of the heat pipe taken along line A—A of FIG. 4. The heat pipe 400 includes a hollow core 402 that contains the coolant. The core 402 is surrounded by a wicking layer 403 for transporting condensed vapor from a cool region of the heat pipe 400 to a hot region of the heat pipe 400. The wicking layer 403 is then surrounded by a thermal conductor layer 404, such as copper or aluminum, for transferring thermal energy to a heat sink, e.g., the heat spreader 102 and the frame casting 110.

Referring again to FIG. 5, the frame casting 110 includes a vent 112 where air within the computer system is exhausted when a fan 108 (FIG. 1) is operating. In a preferred embodiment, the condensation portion 104" is positioned over a part of the vent 112 so that when air is exhausted by the fan 108, the exhausted air provides additional cooling to the heat pipe 104 and to the frame casting 110. This improves the overall cooling capacity of the system 100.

In another preferred embodiment, the condensation portion 104" is also in thermal contact with a fin stack that is disposed at the vent 112 location. The fin stack provides additional heat dissipation capacity.

Figure 7:
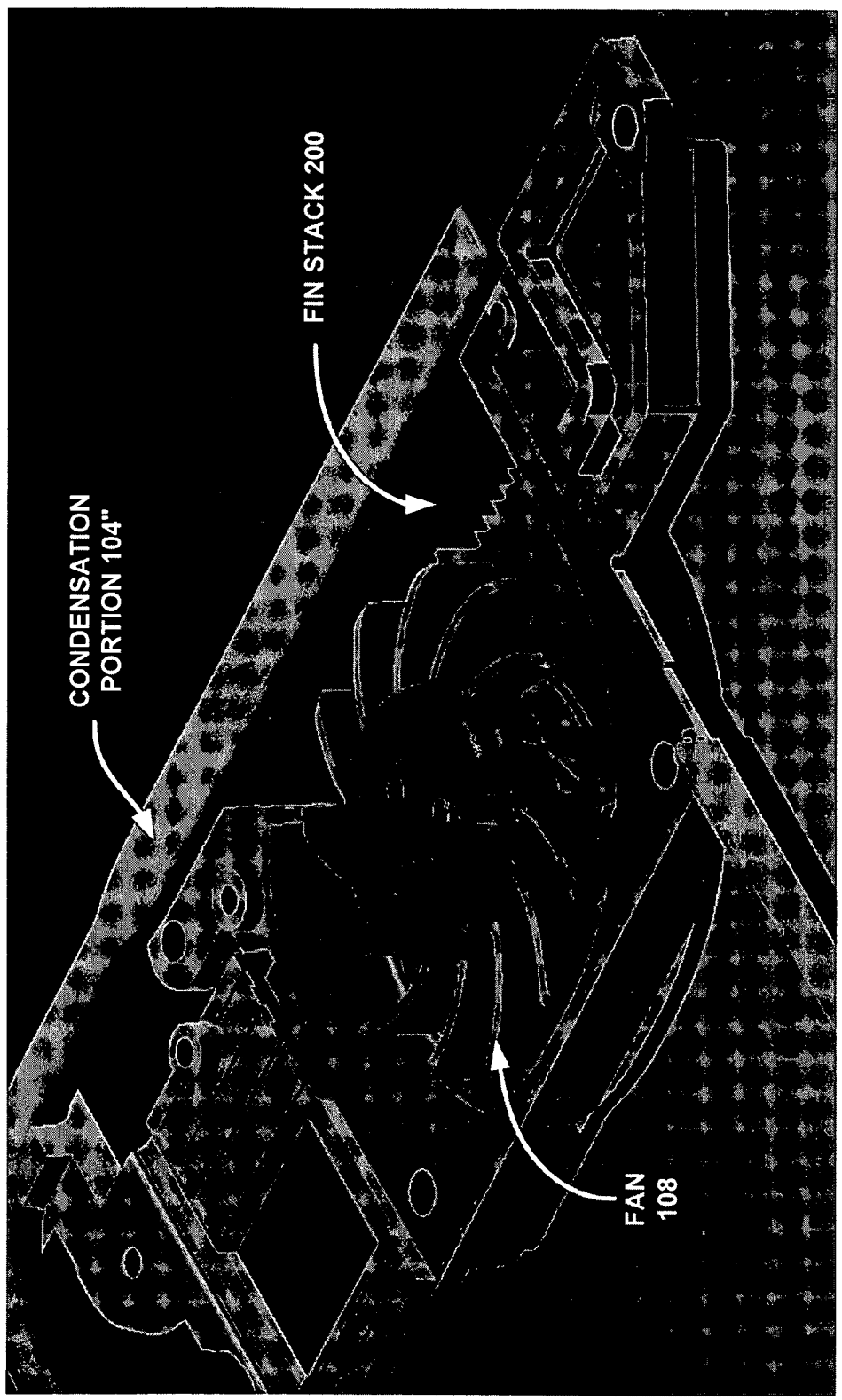
FIG. 7 is a front perspective view of the fan, heat pipe and fin stack according to a preferred embodiment of the present invention.
Figure 8:
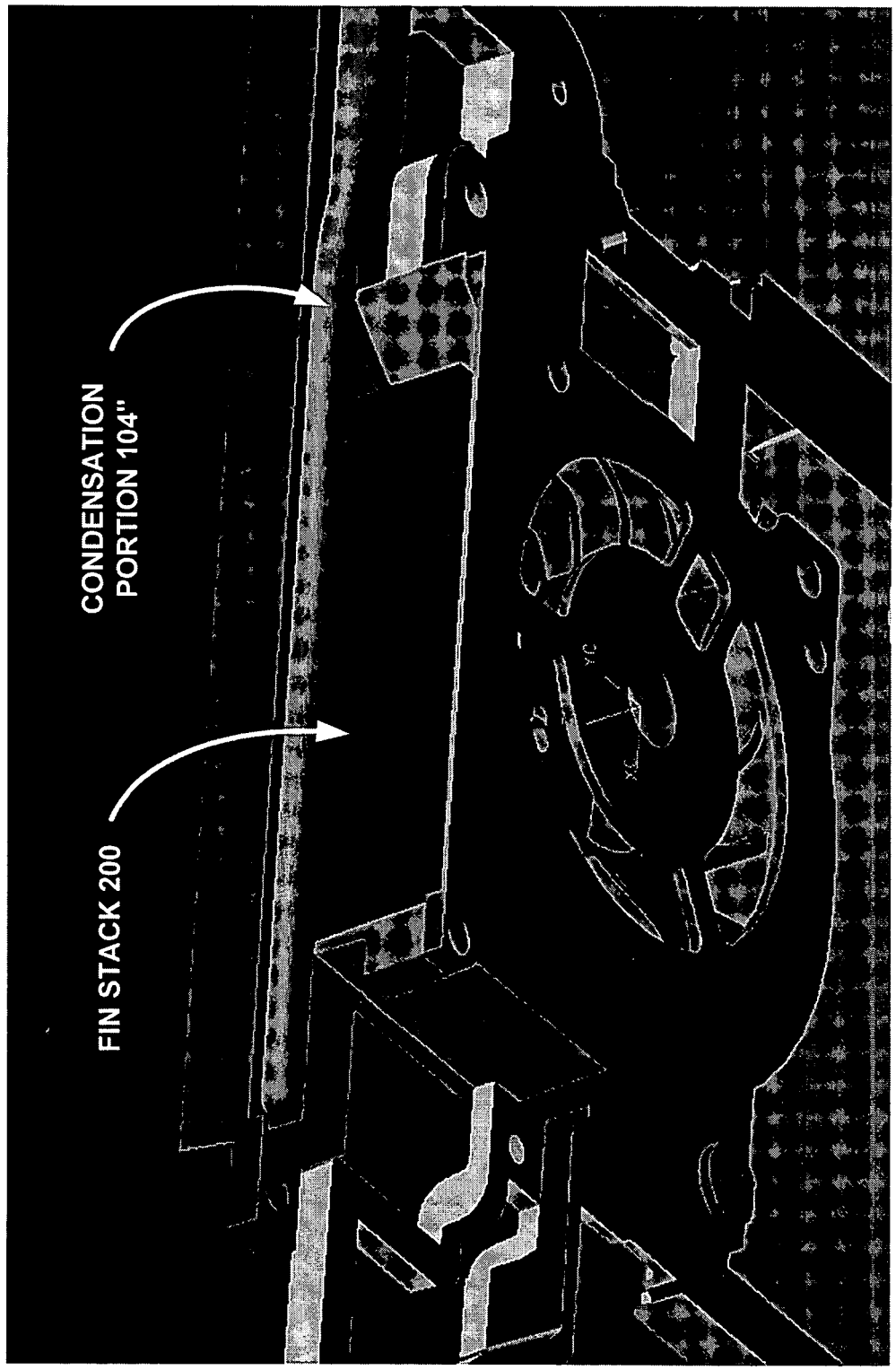
FIG. 8 is a back perspective view of the heat pipe and fin stack according to a preferred embodiment of the present invention.

FIG. 7 is front perspective view of the fin stack in relation to the condensation portion 104" and fan, and FIG. 8 is a back perspective view of the fin stack in relation to the condensation portion 104". As is shown in both figures, the condensation portion 104" makes thermal contact with each fin in the fin stack 200. Accordingly, the fin stack 200 effectively increases the heat transfer rate between the condensation portion 104" and the ambient air. Because the fin stack 200 is located at the vent (not shown), the exhausted air actively cools the fin stack 200 when the fan 108 is operating, which further improves heat dissipation.

The cooling system described above, integrates passive and active cooling mechanisms to dissipate heat generated by the components in the computer. Depending on the temperature of the components, one or both mechanisms can be activated. The passive mechanisms, including the heat spreader 102 with its channels 106, the heat pipe 104, the frame casting 110, and the fin stack 200, in combination provide substantial cooling capacity. If further cooling is required, the fan 108 can be utilized to provide active cooling, which is enhanced by the features described relating to the heat spreader 102, the heat pipe 104, the frame casting 110 and the fin stack 200. Different fan speeds, e.g., low and high, can be designated to provide varying levels of cooling.

A system for dissipating heat generated by components in a computer has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

I claim:

1. A cooling system for a computer comprising:
   a heat spreader that is in thermal contact with a heat generating component in the computer;
   a frame casting; and
   a heat pipe to passively dissipate heat generated from the heat generating component in the computer to the frame casting, the heat pipe including,
      a first portion that is co-planar with and in direct contact with the heat generating component; and
      a second portion that is in thermal contact with the frame casting,
   wherein the first portion of the heat pipe is embedded in the heat spreader and the second portion of the heat pipe extends from the heat spreader to the frame casting and is in thermal contact with the frame casting along a length of the frame casting, and
   wherein the first portion of the heat pipe has a circular cross-section, and the second portion of the heat pipe has a rectangular cross-section, a longer edge of the rectangular cross-section being in contact with the frame casting.

2. The system of claim 1, wherein conductive and convective heat transfer characteristics of the frame casting are utilized to provide additional passive cooling for the heat generating component.

3. The system of claim 1, further comprising one or more ancillary heat pipes embedded in the heat spreader, wherein the one or more ancillary heat pipes make thermal contact with the heat generating component.

4. The system of claim 1, further comprising a radial fan in the computer for blowing air in the computer and exhausting the air from the computer through a vent in the frame casting, wherein the second portion of the heat pipe is disposed over the vent such that the air exhausted through the vent by the radial fan actively cools both the second portion of the heat pipe and the frame casting.

5. The system of claim 4, further comprising a fin stack located at the vent in the frame casting, wherein the second portion of the heat pipe is also in thermal contact with the fin stack.

6. The system of claim 4, wherein a top surface of the heat spreader includes a plurality of channels for increasing surface area and improving the heat transfer rate between the heat spreader and the air in the computer.

7. The system of claim 6, wherein the plurality of channels are formed on the top surface of the heat spreader such that each channel points to a center of the radial fan to direct air flow in the computer to the radial fan.

8. The system of claim 1, wherein a bottom surface of the heat spreader includes a thermal interface contact for each heat generating component in the computer to reduce thermal resistance between the heat spreader and each heat generating component.

9. The system of claim 1, wherein:
   the first portion of the heat pipe comprises an evaporative portion of the heat pipe; and
   the second portion of the heat pipe comprises a condensation portion of the heat pipe,
   wherein heat generated by the heat generating component is transferred to coolant within the evaporative portion of the heat pipe to vaporize the coolant, and wherein the vaporized coolant is cooled within the condensation portion of the heat pipe and transfers the heat generated by the heat generating component to the frame casting.

10. The system of claim 9, wherein the heat pipe comprises:
    a hollow core that contains the coolant; and
    a wicking layer surrounding the hollow core for transporting the vaporized coolant from the evaporative portion of the heat pipe to the condensation portion of the heat pipe.

11. The system of claim 10, wherein the heat pipe further includes a thermal conductive layer surrounding the wicking layer for transferring at least a portion of the heat generated by the heat generating component to the frame casting and the heat spreader.

12. The system of claim 11, wherein the heat generating component comprises a central processing unit (CPU), a graphical processing unit (GPU), or a chipset.

13. A cooling system for a computer comprising:
    a heat spreader having a top surface and a bottom surface, wherein the bottom surface of the heat spreader is in direct contact with a heat generating component in the computer, and wherein the top surface of the heat spreader includes a plurality of channels for increasing a surface area of the heat spreader and improving the heat transfer rate between the heat spreader and air in the computer;
    a radial fan in the computer for blowing the air in the computer and exhausting the air through a vent of the computer,
    a frame casting; and
    a heat pipe coupled to the heat spreader and coupled to the frame casting for passively dissipating heat generated from the heat generating component in the computer to the frame casting, the heat pipe including a first portion that is co-planar with and in direct contact with the heat generating component, the heat pipe further including a second portion that is in thermal contact with the frame casting,
    wherein the plurality of channels are formed on the top surface of the heat spreader such that each channel points to a center of the radial fan to reduce resistance of air flow in the computer to the radial fan,
    wherein the first portion of the heat pipe is embedded in the heat spreader and the second portion of the heat pipe extends from the heat spreader to the frame casting and is in thermal contact with the frame casting along a length of the frame casting, and
    wherein the first portion of the heat pipe has a circular cross-section, and the second portion of the heat pipe has a rectangular cross-section, a longer edge of the rectangular cross-section being in contact with the frame casting.

14. A cooling system for a computer comprising:
a heat spreader having a top surface and a bottom surface, wherein the bottom surface of the heat spreader is in direct contact with a heat generating component in the computer, and wherein the top surface of the heat spreader includes a plurality of channels for increasing a surface area of the heat spreader and improving the heat transfer rate between the heat spreader and air in the computer;
a radial fan in the computer for blowing the air in the computer and exhausting the air through a vent of the computer,
a frame casting; and
a heat pipe coupled to the heat spreader and coupled to the frame casting for passively dissipating heat generated from the heat generating component in the computer to the frame casting, the heat pipe including a first portion that is co-planar with and in direct contact with the heat generating component, the heat pipe further including a second portion that is in thermal contact with the frame casting,
wherein the plurality of channels are formed on the top surface of the heat spreader such that each channel points to a center of the radial fan to reduce resistance of air flow in the computer to the radial fan,
wherein the first portion of the heat pipe is embedded in the heat spreader and the second portion of the heat pipe extends from the heat spreader to the frame casting and is in thermal contact with the frame casting alone a length of the frame casting,
wherein the first portion of the heat pipe comprises an evaporative portion of the heat pipe, and the second portion of the heat pipe comprises a condensation portion of the heat pipe, and
wherein heat generated by the heat generating component is transferred to coolant within the evaporative portion of the heat pipe to vaporize the coolant, and wherein the vaporized coolant is cooled within the condensation portion of the heat pipe and transfers the heat generated by the heat generating component to the frame casting.

* * * * *

UNITED STATES PATENT AND TRADEMARK OFFICE
CERTIFICATE OF CORRECTION

| | | |
|---|---|---|
| PATENT NO. | : 7,190,577 B2 | Page 1 of 1 |
| APPLICATION NO. | : 10/951953 | |
| DATED | : March 13, 2007 | |
| INVENTOR(S) | : Ihab Ali | |

It is certified that error appears in the above-identified patent and that said Letters Patent is hereby corrected as shown below:

Column 8, Line 8 in Claim 14, replace:

"with the frame casting alone" with
--with the frame casting along--

Signed and Sealed this

Eighth Day of May, 2007

JON W. DUDAS
*Director of the United States Patent and Trademark Office*